United States Patent

Glass et al.

[11] Patent Number: 5,667,587
[45] Date of Patent: Sep. 16, 1997

[54] APPARATUS FOR GROWING SILICON CARBIDE CRYSTALS

[75] Inventors: Robert C. Glass, Chapel Hill, N.C.; Walter E. Gaida, East Pittsburgh, Pa.; Ronald R. Ronallo, Pittsburgh, Pa.; Hudson McDonald Hobgood, Murrysville, Pa.

[73] Assignee: Northrop Gruman Corporation, Los Angeles, Calif.

[21] Appl. No.: 769,090

[22] Filed: Dec. 18, 1996

[51] Int. Cl.⁶ .................... C23C 14/00; C30B 27/36
[52] U.S. Cl. ..................... 117/200; 117/951; 118/715
[58] Field of Search ................... 117/200, 951; 118/715

[56] References Cited

U.S. PATENT DOCUMENTS

| 5,433,167 | 7/1995 | Furukawa | 117/951 |
| 5,441,011 | 8/1995 | Takahaski | 117/951 |

*Primary Examiner*—Richard Bueker
*Attorney, Agent, or Firm*—Walter G. Sutcliff

[57] ABSTRACT

A silicon carbide growth container for placement into a crystal growing furnace. The growth container has a liner of pyrolytic graphite which seals the inside of the container and allows for easy removal of the grown silicon carbide crystal.

8 Claims, 2 Drawing Sheets

5,667,587

APPARATUS FOR GROWING SILICON CARBIDE CRYSTALS

BACKGROUND OF THE INVENTION

1. Field of the Invention

The invention in general relates to crystal growth and more particularly to the production of silicon carbide crystals with improved processability and defect and impurity reduction.

2. Description of Related Art

Silicon carbide is being used extensively as a semiconductor material for various electronic applications. Semiconductor devices of silicon carbide have the ability to operate at higher voltages and temperatures than conventional silicon or gallium arsenide devices thus providing for higher power devices with reduced cooling requirements. Electronic applications for silicon carbide semiconductor devices include compact, low cost airborne, ship and ground radars, aircraft engine and flight controls, electric tank and ship propulsion systems and satellite communications, to name a few. In the commercial sector, silicon carbide may be used in the field of high definition television, industrial power conditioning, nuclear control and instrumentation and electric vehicle power trains.

Pure silicon carbide crystals may be grown in a variety of ways, one of which utilizes a seed crystal of silicon carbide positioned within a furnace which also includes a source of pure silicon carbide. The source is heated to a temperature whereby the silicon carbide sublimates and is deposited upon the seed crystal. In one process, the seed crystal is positioned within a container having a growth cavity for the crystal. The container is of a material, such as graphite, which can withstand the temperatures experienced within the furnace.

As silicon carbide is deposited from the source, a silicon carbide crystal, called a boule, is grown within the container and comes into contact with the wall of the growth cavity and may actually fuse with it. After the boule is grown to the desired size, the container is removed from the furnace for separation of the grown crystal. During the separation process the container is physically ground away. Due to the interaction of the crystal periphery with the container, when the boule surface is reached the grinding process must continue at a much slower rate to avoid undue stressing of the crystal. The total grinding operation is a laborious and extremely time consuming process and reduces the total area of the final substrates derived from the boule.

In addition, the interaction of the boule with the wall of the growth container may cause or contribute to (a) undesired formation of secondary silicon carbide grains nucleated on the container wall, as well as (b) low angle boundaries which are misorientations of local areas of the substrate.

The present invention obviates the tedious grinding of the boule surface, improves crystal purity, and reduces or eliminates various defects.

SUMMARY OF THE INVENTION

Apparatus for growing silicon carbide crystals in accordance with the present invention includes a crystal growth container which is placed within a crystal growing furnace. The container has a crystal growing cavity which extends along a longitudinal axis and positioned within the cavity is a thermally anisotropic liner surrounding the longitudinal axis. The liner is of a material which will withstand the temperatures encountered in the furnace during crystal growth and in a preferred embodiment the liner is made of pyrolytic graphite and contacts the inner wall of the container.

DESCRIPTION OF THE PREFERRED EMBODIMENTS

Figure 1:
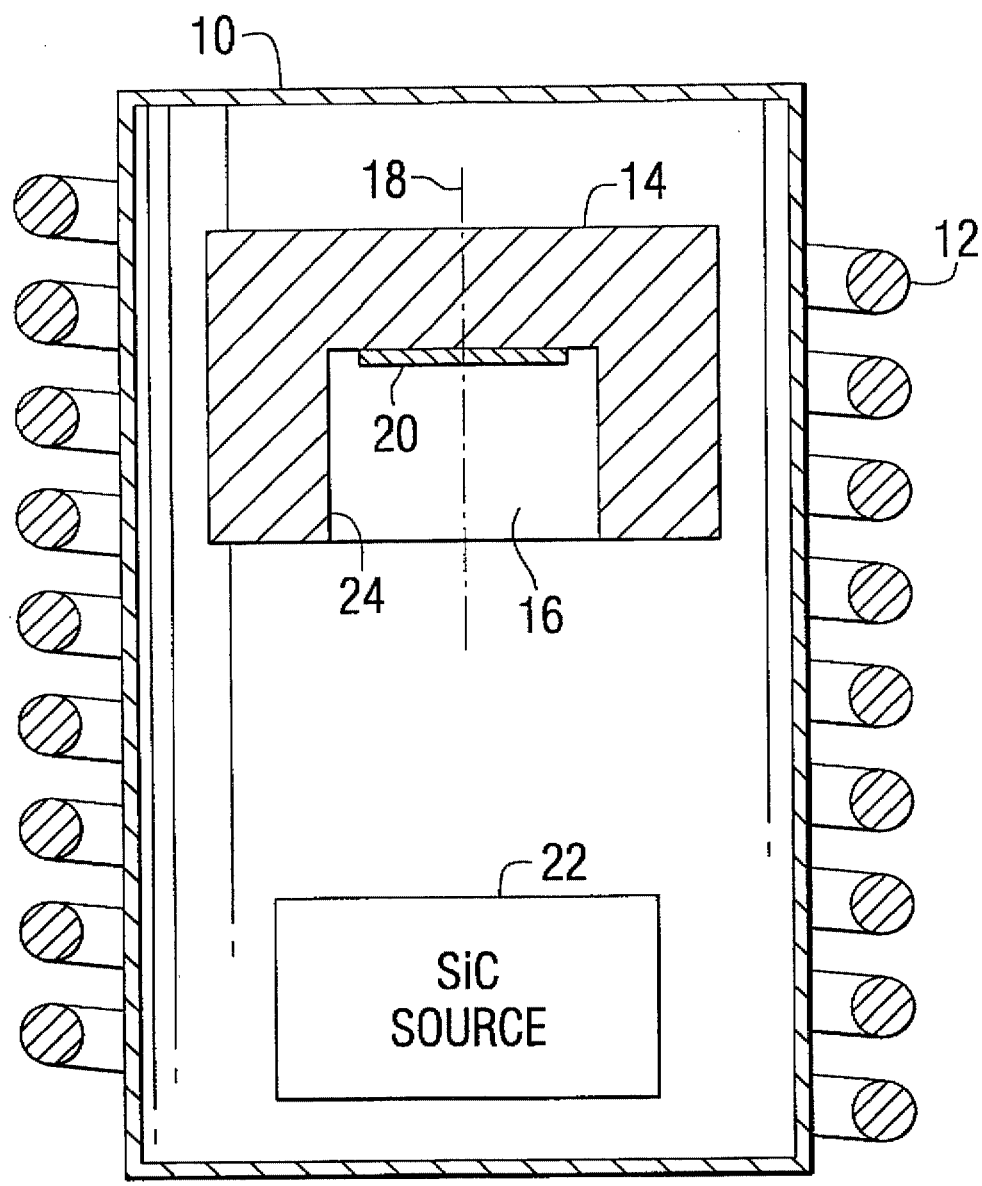
FIG. 1 illustrates, partially in cross section, some basic components of typical crystal growing apparatus utilized for growing silicon carbide boules.

Referring now to FIG. 1 there is illustrated some basic components utilized in the growing of crystals such as silicon carbide crystals. The crystal is grown in a furnace 10 which is heated to desired temperatures by means of an induction heating system 12. Within the furnace 10 there is located a crystal growth container 14 having a crystal growth cavity 16 which surrounds a longitudinal axis 18.

A seed crystal 20 of silicon carbide is affixed at one end of the growth cavity 16 and silicon carbide is deposited thereon such as by vapor deposition, from a source 22 of pure silicon carbide. As the silicon carbide crystal grows in length in the cavity 16 it also contacts the inner wall 24 of the container 14, which is usually of a graphite material, and may actually fuse with the wall. As previously brought out, this fusion presents various processability, defect and impurity problems.

Figure 2:
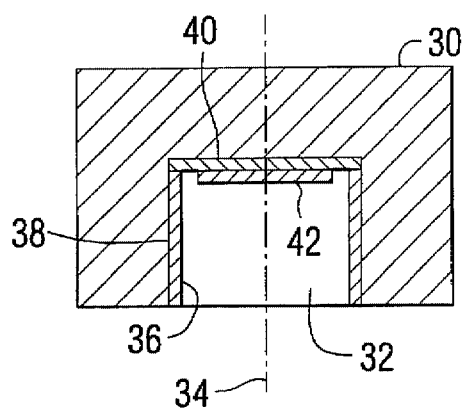
FIG. 2 illustrates, in cross section, one embodiment of the present invention.

FIG. 2 illustrates an embodiment of the invention which reduces or eliminates these problems and in addition will allow for experimentation with various factors which affect crystal growth.

The apparatus in FIG. 2 includes a crystal growth container 30, similar to that shown in FIG. 1 in having a crystal growth cavity 32 which surrounds a longitudinal axis 34. Positioned within the growth cavity 32 and surrounding the longitudinal axis 34 is a liner 36, which in the embodiment of FIG. 2 contacts the inner wall 38 of the growth cavity 32. For a growth cavity closed at one end, as illustrated, the liner also includes an end cover 40 to which is affixed the seed crystal 42.

Figure 3:
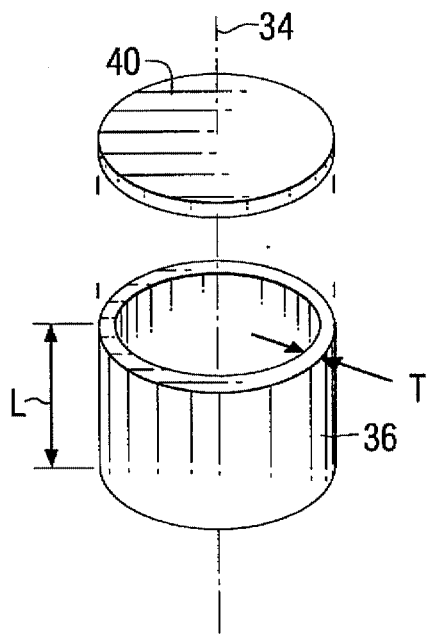
FIG. 3 illustrates the liner, shown in FIG. 2, in more detail.

FIG. 3 show an exploded view of the liner 36. For a cylindrical growth cavity 32 the liner 36 is in the form of a right circular cylinder of length L and of a uniform thickness T. Liner 36 as well as end section 40 are of a material which can withstand the temperatures encountered during crystal growth and has anisotropic properties, particularly thermal anisotropy. One material meeting these requirements is pyrolytic graphite which is a commercially available item having a unique structure formed of parallel layers of pure carbon atoms with a preferred orientation. Thus in FIG. 3 the layered structure of the liner 36 conducts heat much more efficiently along its length L parallel to the carbon layers, than through the liner wall in the thickness T direction. This produces a more uniform heating along the axial length of the growing silicon carbide boule.

The pyrolytic graphite liner 36 effectively seals the growth cavity 32 so that there is no vapor transport to the inner wall 38 thus preventing secondary nucleation thereon and reducing vapor losses. The pyrolytic graphite itself has an extremely smooth surface such that no nucleation can occur on it. Since there is virtually no vapor transport out of the growth cavity 32 to the container 30, due to the pyrolytic graphite liner, the sublimated vapor composition may be modified for experimental purposes to see the effects on crystal growth.

The structure and composition of the pyrolytic graphite liner 36 also allows for ease of boule removal without the requirement for grinding the boule surface. After normal removal of the growth container 30 material, such as by grinding, the pyrolytic graphite liner 36 merely peels away from the grown boule thus leaving a greater boule volume and without stressing the silicon carbide crystal.

Figure 4:
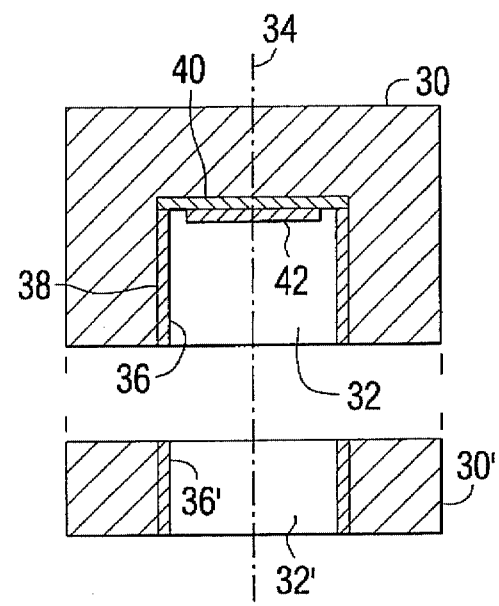
FIG. 4 illustrates, in cross section, an embodiment of the invention for extending the length of the growth cavity.

If a longer boule is to be grown than can be accomodated by the length of growth cavity 32 then an extension portion may be added as illustrated in FIG. 4. The extension 30' includes a growth cavity 32' which is sealed from the extension material by a section of liner 36' of pyrolytic graphite. The extension unit may then be held in position against the open end of growth container 30.

Figure 5:
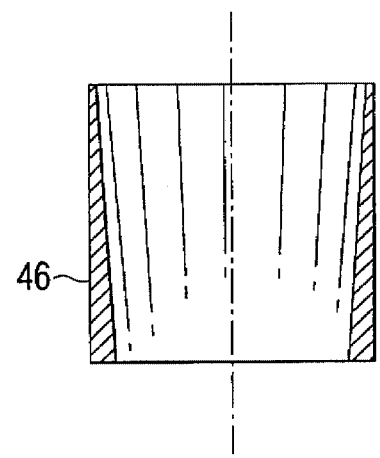
FIG. 5 illustrates, in cross section, another embodiment of the invention.

In addition to being able to experiment with different vapor compositions, the invention also allows for variable heating of the growth cavity. This may be accomplished, as illustrated in FIG. 5, by tailoring the thickness of the pyrolytic graphite liner. FIG. 5 shows, by way of example, a liner 46 wherein the thickness of the wall varies directly with length, although other variations are possible.

What is claimed is:

1. Apparatus for use in the growth of silicon carbide crystals, comprising:

(a) a crystal growth container for placement in a crystal growing furnace;

(b) said container having a crystal growing cavity which extends along a longitudinal axis; and (c) a thermally anisotropic liner disposed within said cavity surrounding said longitudinal axis.

2. Apparatus according to claim 1 wherein:

(a) said liner is made of pyrolytic graphite.

3. Apparatus according to claim 1 wherein:

(a) said liner is symmetrically disposed around said longitudinal axis.

4. Apparatus according to claim 3 wherein:

(a) said liner is cylindrical.

5. Apparatus according to claim 1 wherein:

(a) said liner contacts the wall of said cavity.

6. Apparatus according to claim 2 wherein:

(a) said cavity is closed at one end and said liner includes an end portion of pyrolytic graphite.

7. Apparatus according to claim 1 which includes:

(a) a cavity extension having an opening extending along a longitudinal axis:

(b) a thermally anisotropic liner positioned within said opening;

(c) said cavity extension being positioned against one end of said container.

8. Apparatus according to claim 1 wherein:

(a) said liner has a thickness which varies along the length thereof.

\* \* \* \* \*